(12) United States Patent
Atehortua et al.

(10) Patent No.: US 7,345,453 B2
(45) Date of Patent: Mar. 18, 2008

(54) CAPACITY DEGREDATION IN A LEAD ACID BATTERY METHOD AND APPARATUS

(75) Inventors: Hector M. Atehortua, North Bergen, NJ (US); Steven Hoenig, Staten Island, NY (US); Thirumalai G. Palanisamy, Morristown, NJ (US); Harmohan N. Singh, Rockaway, NJ (US)

(73) Assignee: Honeywell International, Inc., Morristown, NJ (US)

( * ) Notice: Subject to any disclaimer, the term of this patent is extended or adjusted under 35 U.S.C. 154(b) by 304 days.

(21) Appl. No.: 11/067,788

(22) Filed: Mar. 1, 2005

(65) Prior Publication Data
US 2006/0197504 A1 Sep. 7, 2006

(51) Int. Cl.
*H02J 7/00* (2006.01)
(52) U.S. Cl. .................................. 320/134; 324/426
(58) Field of Classification Search ............... 320/132, 320/148, 149, 152, 156, 157, 164, 161; 324/522, 324/713, 433, 429, 428, 427, 426
See application file for complete search history.

(56) References Cited

U.S. PATENT DOCUMENTS

| | | | |
|---|---|---|---|
| 4,433,294 A | 2/1984 | Windebank | |
| 4,745,349 A | 5/1988 | Palanisamy et al. | |
| 5,049,803 A * | 9/1991 | Palanisamy | 320/132 |
| 5,160,880 A * | 11/1992 | Palanisamy | 320/106 |
| 5,644,209 A * | 7/1997 | Chabbert et al. | 320/122 |
| 5,808,447 A * | 9/1998 | Hagino | 320/139 |
| 5,926,008 A | 7/1999 | Palanisamy et al. | |
| 6,094,051 A * | 7/2000 | Palanisamy et al. | 324/426 |
| 7,076,375 B2 * | 7/2006 | Raichle et al. | 702/63 |
| 7,078,879 B2 * | 7/2006 | Makhija | 320/133 |
| 7,148,657 B2 * | 12/2006 | Raichle et al. | 320/162 |
| 2002/0193953 A1 | 12/2002 | Hoenig et al. | |
| 2003/0006735 A1 * | 1/2003 | Kawakami et al. | 320/133 |
| 2004/0160214 A1 * | 8/2004 | Blair et al. | 320/118 |

FOREIGN PATENT DOCUMENTS

EP 1167988 A1 1/2002

OTHER PUBLICATIONS

International Search Report dated Jul. 6, 2006.

* cited by examiner

*Primary Examiner*—Bao Q. Vu
*Assistant Examiner*—Nguyen Tran
(74) *Attorney, Agent, or Firm*—Oral Caglar, Esq.

(57) ABSTRACT

In accordance with the invention, there is a battery defect detection method comprising applying a current ramp to a battery; determining a first time ($t_1$) when a current of the battery reaches a maximum current ($I_{peak}$), and determining a second time ($t_2$) when a terminal voltage of the battery reaches a maximum voltage ($V_{peak}$). The method also includes determining a differential (d), wherein $d=/(t_1)-(t_2)/$, and wherein (d) corresponds to a magnitude of defects in the battery.

14 Claims, 7 Drawing Sheets

Figure 2 - Current & Voltage Curves

Figure 3 - Voltage & dV/dt Curves

Figure 4 - (d) Measurement of "Healthy" Battery

Figure 5 - (d) Measurement of Defective Battery

Figure 6 – Capacity prediction performance comparison

CAPACITY DEGRADATION IN A LEAD ACID BATTERY METHOD AND APPARATUS

DESCRIPTION OF THE INVENTION

1. Field of the Invention

The invention relates to methods and an apparatus for determining battery parameters such as battery capacity and battery analysis, and more particularly, to methods and an apparatus for determining capacity degradation in a battery.

2. Background of the Invention

It is often desirable to determine whether a battery is functioning properly. Some systems test battery function by testing battery capacity through a full discharge under a specific load. A historical record of the measured capacities of the battery needs to be kept to determine battery degradation over time. In addition, this approach can cause problems when latent reaction defects are present in the battery. Latent reaction defects are generally understood to be a situation where the battery initially discharges normally, as defined by capacity, internal resistance, and polarization resistance, but after time and after battery conditions change, the discharge curve begins to drop more rapidly due to latent capacity deterioration. At the present time, this defect can only be detected by observing a complete discharge cycle.

Thus, there is a need to overcome these and other problems of the prior art and to provide a better methodology and apparatus for detecting defects during the capacity determination procedure, which would allow defect detection without requiring battery discharge.

SUMMARY OF THE INVENTION

In accordance with the invention, there is a battery defect detection method comprising applying a current to a battery; determining a first time ($t_1$) when a current of the battery reaches a maximum current ($I_{peak}$), and determining a second time ($t_2$) when a terminal voltage of the battery reaches a maximum voltage ($V_{peak}$). The method also includes determining a differential (d), wherein $$(d)=|(t_1)-(t_2)|$$

and wherein (d) corresponds to a magnitude of defects in the battery.

In accordance with another embodiment of the invention, there is a battery defect detection apparatus comprising a control module comprising an analog-to-digital converter, a digital-to-analog converter, and an electronics control system. The apparatus also includes a power supply that supplies a current ramp to a battery, a sensor electrically connected to the battery measures the battery terminal voltage, and a processor determines a first time ($t_1$) when a current of the battery reaches a maximum current ($I_{peak}$). The processor can also determine a second time ($t_2$) when a terminal voltage of the battery reaches a maximum voltage ($V_{peak}$). The processor also determines a differential (d), wherein $$(d)=|(t_1)-(t_2)|$$

and wherein (d) corresponds to a magnitude of defects in the battery.

According to another embodiment of the invention, there is a computer readable medium that contains program code that configures a processor to perform a method for determining the magnitude of defects in a battery. The program code comprises program code for controlling application of a current to a battery, program code for determining a first time ($t_1$) when a current of the battery reaches a maximum current ($I_{peak}$), and program code for determining a second time ($t_2$) when a terminal voltage of the battery reaches a maximum voltage ($V_{peak}$). The computer readable medium also includes program code for determining a differential (d), wherein $$(d)=|(t_1)-(t_2)|$$

and wherein (d) corresponds to a magnitude of defects in the battery.

Additional advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments and together with the description, serve to explain the principles of the invention.

DETAILED DESCRIPTION

Reference will now be made in detail to the exemplary embodiments, examples of which are illustrated in the accompanying drawings. Wherever possible, the same reference numbers will be used throughout the drawings to refer to the same or like parts.

Embodiments described herein provide for detection of defects, which can lead to battery capacity degradation, without requiring battery discharge. Automated capacity determination algorithms can report the defect and/or predict capacity information of the battery to the user. Various embodiments described herein allow for automated and rapid defect detection in batteries, such as lead-acid batteries, without requiring additional testing of the battery. The detection technique can work in conjunction with existing automated capacity determination techniques.

FIGS. 1-7 disclose, generally, apparatus and methods for determining the degradation of a battery.

Figure 1:
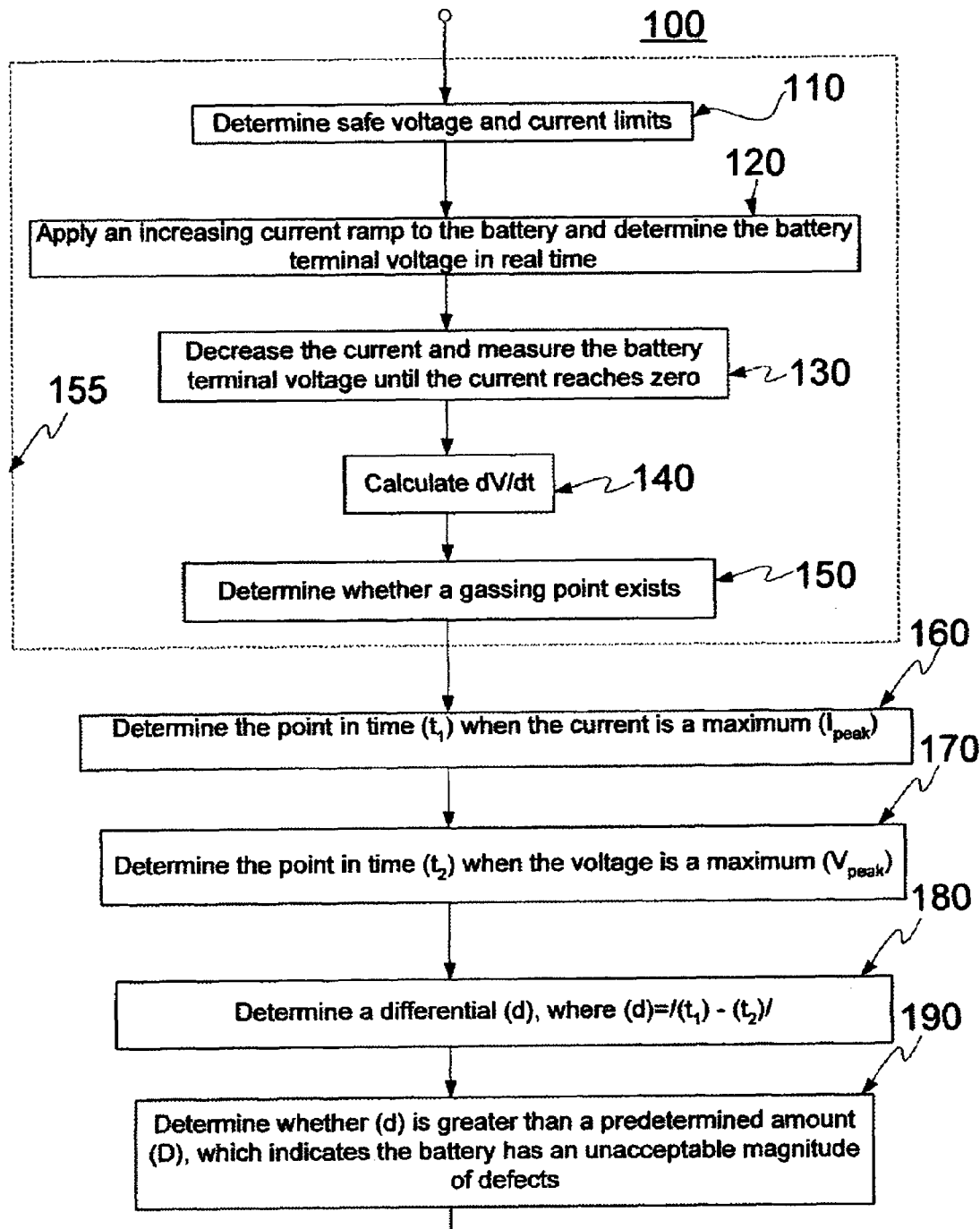
FIG. 1 depicts a flow chart of a method capable of determining the degradation of a battery in accordance with an exemplary embodiment.

FIG. 1 depicts an exemplary flow chart of a method 100 to determine the degradation of a battery. In various embodiments, at 110 a safe voltage and a current limit can be determined for a battery. The safe voltage and current limit can be established from known battery characteristics. In some instances, this information may be provided by the battery manufacturer.

As shown at 120 an increasing current ramp is applied to the battery, such as, for example, a lead-acid battery having at least one cell, while battery voltage is measured in real time at the battery terminals. In certain embodiments, the linearly increasing current ramp can have a predetermined slope. The current is increased to a predetermined value, such as the safe voltage, and then decreased at the same slope while the battery voltage is measured in real time. As shown at 130, the current is decreased until the current is zero. Measuring the battery voltage provides a response voltage (V) of the battery to the applied current. At 140 the slope of the response voltage (dV/dt) is determined and recorded along with the measured applied current and voltage response data.

In various embodiments, the slope of the response voltage (dV/dt) can be determined by calculating the difference in successive voltage data points received in the real time measurement of the battery voltage over small time intervals. The result of the calculation can be applied to an appropriate smoothing program, which will be known to one of ordinary skill in the art, to reduce or eliminate noise caused by the measurement system.

In various embodiments the presence of a gassing point is determined as shown at 150. Generally, a gas point occurs when the applied current causes hydrogen gas and oxygen gas to be generated from water in an electrolyte within a cell. Further, the gassing point can indicate the time in the cycle when the battery response to the applied current ramp switches between one that is primarily a gassing response and one that is primarily a charging response. Further, the gassing point can indicate the time in the cycle when the battery response to the applied current switches between one that is a charge response and one that is a gassing response.

In various embodiments the gassing point can be determined by calculating the local maximum values of the (dV/dt) curve. For example, the slope going through a maximum can indicate the transition from a charge reaction to an overcharge reaction in the increasing current ramp, and a transition from an overcharge reaction to a charge reaction in the decreasing current ramp. The current and voltage at which this occurs are referred to, respectively, as the gas current ($I_{gas}$) and the gas voltage ($V_{gas}$). A battery response to the cycle can exhibit a (dV/dt) maximum on both the increasing and decreasing portion of the current ramp. The current and the voltage values corresponding to the transition point on the increasing portion of the ramp are referred to as ($I_{up}$) and ($V_{up}$), while those values on the decreasing portion of the ramp are referred to as ($I_{down}$) and ($V_{down}$).

The presence of a gassing point indicates that the entire battery charge-discharge cycle is represented in the test cycle response. This assists in detecting potential defects that may occur through any point within the entire battery discharge cycle. This information is useful in determining the degradation of a battery according to various embodiments. For example, the application of the current cycle can be used to simulate the battery's charge-discharge cycle performance without requiring a time consuming and battery deteriorating technique that actually cycles the battery.

According to various embodiments, portions of the method described above, and shown surrounded by a dotted line labeled 155 in FIG. 1, can be done before starting an actual battery test. The information obtained in this portion can be used to gain information about the battery.

According to various embodiments, a time ($t_1$) is determined corresponding to the time in the current ramp when the current reaches a maximum current ($I_{peak}$), as shown at 160. According to various embodiments, ($I_{peak}$) can be determined directly from the applied current curve. Further a point in time ($t_2$) is determined when the terminal voltage of the battery reaches a maximum voltage ($V_{peak}$), as shown at 170. In some cases, ($V_{peak}$) can be determined directly from the voltage response curve.

Figure 2:
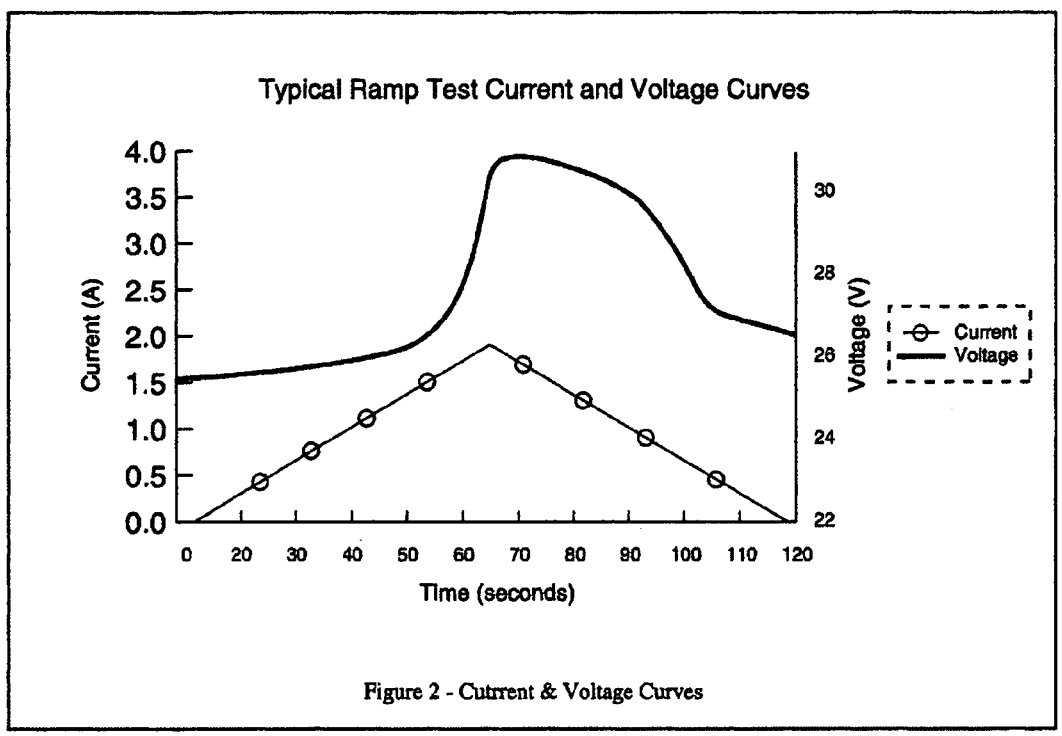
FIG. 2 depicts a sample battery response cycle according to an exemplary embodiment.
Figure 3:
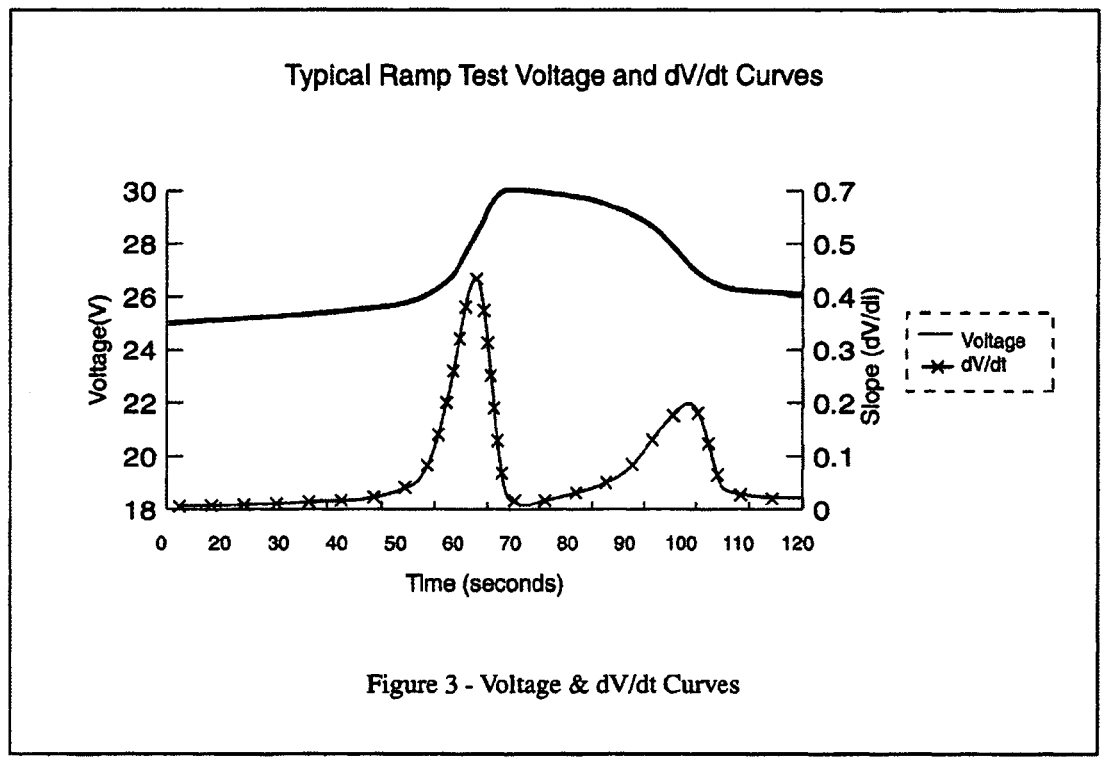
FIG. 3 depicts a sample battery response cycle according to an exemplary embodiment.

In order to provide an illustrative example, FIGS. 2 and 3 depict a sample battery cycle. It is to be understood, however, that the embodiments shown in FIGS. 2 and 3 are not to be limiting but are used as illustrative tools for understanding various embodiments. Accordingly, FIG. 2 depicts a battery test cycle including a current ramp, and the voltage response of a battery that exhibits at least one gassing point. The embodiment shown in FIG. 2 depicts a linearly increasing current ramp, shown with a line containing open circles, applied for approximately 60 seconds from 0.0 amps (A) to approximately 2.0 (A). Subsequently, a linearly decreasing current ramp, also shown with a line containing open circles, is applied for approximately 60 seconds until the current reaches 0.0 (A). The voltage response depicted in FIG. 2 with a solid line shows that the voltage increases for more than 60 seconds and then begins to fall after reaching a maximum value. Further, for a healthy battery, for example, one that does not have defects, such as, for example, those disclosed herein, at approximately the time when the applied current begins to decrease, the voltage response should automatically begin falling as well. FIG. 3 depicts (dV/dt), shown with a crossed line, for the voltage response curve, shown with the solid line in FIG. 2 and also reproduced in FIG. 3.

According to various embodiments, the difference between the times ($t_1$), corresponding to ($I_{peak}$), and the time ($t_2$), corresponding to ($V_{peak}$), is called a differential (d) and generally relates to a quantitative difference, as shown in FIG. 1 at 180 and in Equation [1] as follows:

$$(d) = |(t_1) - (t_2)| \quad [1]$$

According to various embodiments, the differential (d) is related to the degree of defects, such as latent capacity degradation defects, present in the battery. Further, a delay amount (D) can be determined to indicate the status of a battery. For example, a value of (d) greater than (D) can indicate the presence of latent capacity defects, as shown in FIG. 1 at 190. For a healthy battery, (d) should be a less than the predetermined delay amount (D). Thus, (d) for a healthy battery should be a minimum, or zero.

Figure 4:
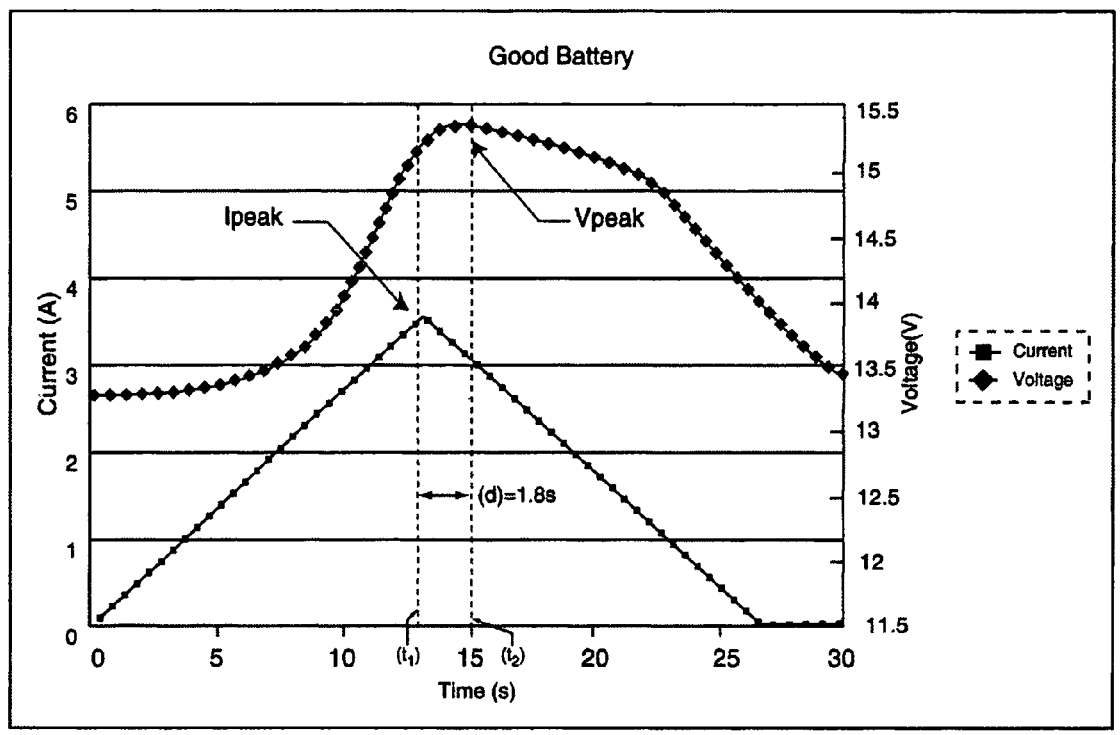
FIG. 4 depicts a sample battery response cycle according to an exemplary embodiment.

Based on a relationship of current (I) times resistance (R), in a healthy batter, the voltage should begin to drop soon after the current is folded back. For example, FIG. 4 depicts an exemplary analysis for a healthy battery. As shown in FIG. 4, a linearly increasing current ramp, shown with a line drawn with squares, is applied until the current reaches ($I_{peak}$), corresponding to time ($t_1$)≈13.2 seconds. Shortly thereafter, the voltage curve, shown with a line drawn with diamonds, reaches the maximum voltage ($V_{peak}$), corresponding to time ($t_2$)≈15.0 seconds. As shown in FIG. 4, the differential (d)≈1.8 seconds, which is relatively short.

However, as a battery begins to deteriorate, the differential (d) begins to increase. This can represent the situation wherein the voltage continues to increase for some time after the applied current is reduced. The amount of the delay between the current and voltage peaks is indicative of the extent and magnitude of the defects. A large delay detected in the ramp test described herein indicates a non-useable battery and that the battery has deteriorated, such as by operation. In a non-useable battery, the battery will not be able to provide power at the required current, thereby causing a collapse in suitable voltage.

Figure 5:
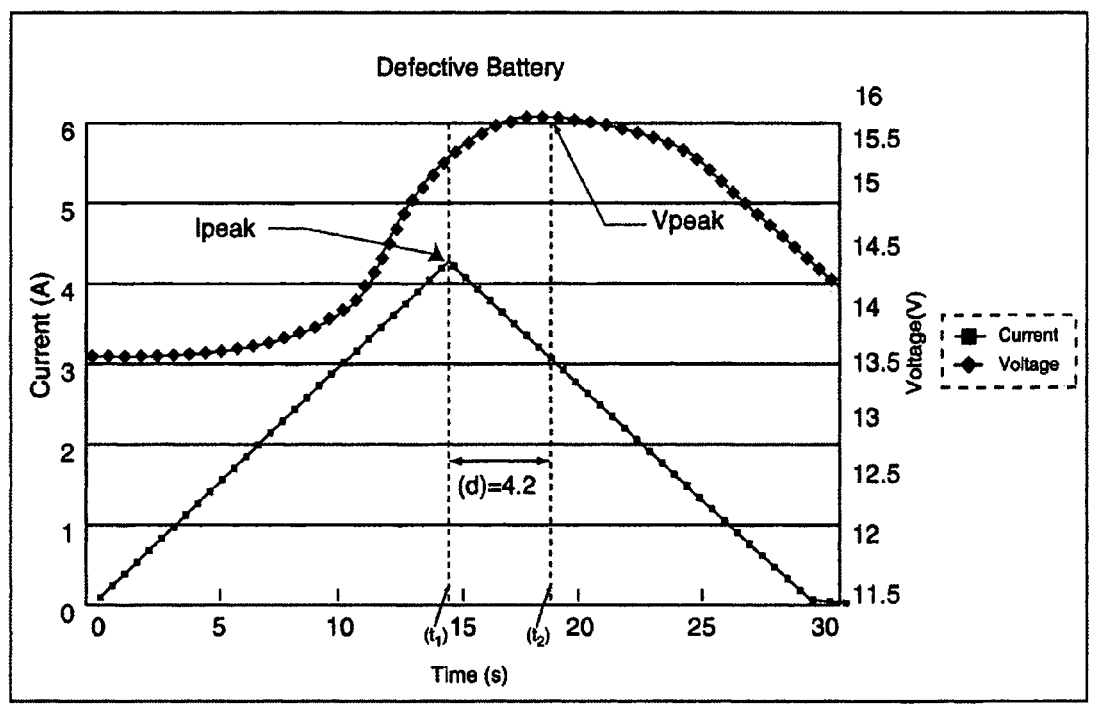
FIG. 5 depicts a sample battery response cycle according to an exemplary embodiment.

As shown in FIG. 5, there is an exemplary analysis for a defective battery. A linearly increasing current ramp, shown in FIG. 5 with a line drawn with squares, is applied until the current reaches ($I_{peak}$), corresponding to time ($t_1$)≈13.2 seconds. After a differential (d), the voltage curve, shown with a line drawn with diamonds, reaches the maximum voltage ($V_{peak}$), corresponding to time ($t_2$)≈17.4 seconds. In this case the differential (d)≈4.2 seconds, which is relatively long.

Figure 6:
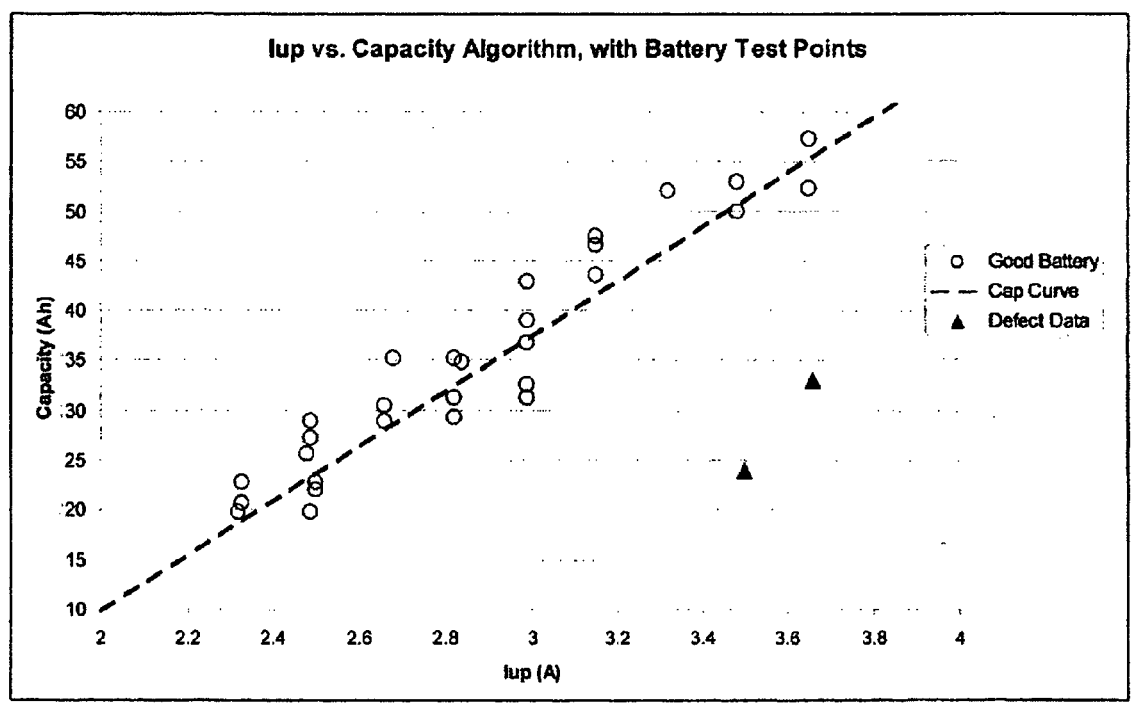
FIG. 6 depicts a sample graph of a battery capacity versus an gassing current.

FIG. 6 depicts an exemplary graph of the battery capacity in amp hours (Ah) versus gassing current ($I_{up}$). The dotted line shows the results of an exemplary predictive algorithm of capacity as a function of ($I_{up}$). The capacity determination results of tests applied to healthy batteries can produce data that fall relatively close to the predictive, dotted line. As can be seen in FIG. 6, a majority of data points (represented by circles) resulting from healthy battery tests results, fall close to the dotted line. The two outlying points (represented by triangles) fall far away from the dotted line. This is a result of the residual response from defect in these two batteries.

According to various embodiments, defects in a battery can be detected and reported to a user. In certain embodiments, the defects can be reported as a degradation in capacity. For example, the defects can be detected by determining the predetermined delay (D), or cutoff limit, above which the battery is categorized as being defective. While not intending to be limited to any particular delay (D), for illustrative purposes, the delay (D) is chosen to be 3.5 seconds. Thus, in this exemplary embodiment, if (d)≧3.5 seconds, the battery is categorized as being defective. It is to be understood that other predetermined delay (D) values, such as 3.0 seconds, can be used for different categories of batteries and for different thresholds of defectiveness. Moreover, (D) can vary depending on, for example, battery size, type, and/or chemistry. Further, in various embodiments, the level of degradation can be determined based on a function of the delay (D) value. For example, a battery can be categorized as defective based on a percentage value of the delay (D) to a total current ramp time.

Further, according to various embodiments, the delay (D) value can be determined for specific batteries or categories of batteries. For example, the ramp test described herein can be designed for a specific battery part number and can be used as an accurate indicator of performance for that battery and its published capacity rating. Moreover, it is understood that different current ramps can be applied to generate different defect determinations. According to various embodiments, this can reduce the need for frequent capacity determinations within a known battery set.

According to various embodiments, the battery state of charge (SOC) does not have to be at 100% for the techniques described herein to work. For example, the SOC can be at any point where gassing can be induced by the current ramp. In this way, the useful range of various methods described herein can be expanded.

Further, despite the fact that gassing may amount to 20% to 25% of the battery cycle, the SOC of a battery is often maintained within this testable range. This is especially appropriate in cases where the battery to be tested is used as a backup power source and the SOC can be held at less than 100% or close to fully charged so as to provide maximal backup potential. Thus, to perform the test the battery to be tested need not be removed from the operating position, such as an aircraft.

According to various embodiments, the techniques described herein can also be used to detect defects due to electrolyte conditions.

Figure 7:
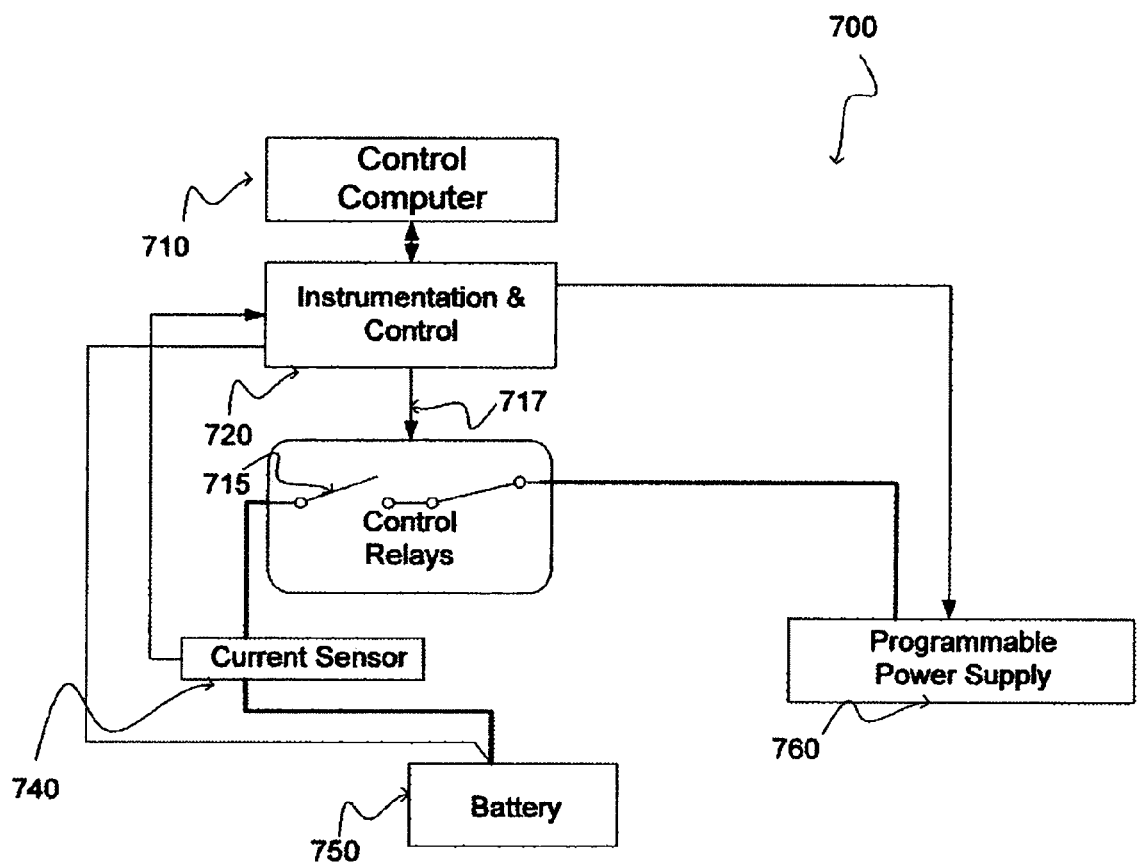
FIG. 7 depicts is depicts a block diagram of a system capable of determining the degradation of a battery in accordance with an exemplary embodiment.

FIG. 7 depicts an exemplary configuration of a system 700 that can determine the capacity degradation in a lead acid battery. In various embodiments, the exemplary system 700 includes various modules, such as a control computer 710, an instrumentation and control module 720, a control relay 730, a current sensor 740, and a power supply 760. Although depicted as separate modules, the system can be implemented in a single unit, such as, for example, the Honeywell TruCharge™ analyzer/charger. Also shown in FIG. 7 is a battery 750, such as a lead-acid battery. In various embodiments, system 700 can also include a display to indicate such things as the capacity degradation of the battery 750.

In various embodiments, control computer 710 can include a set of predictive capacity algorithms. Control computer 710 can also include any software drivers that can be used to control other modules of the exemplary system.

Control computer 710 is connected to instrumentation and control module 720. Control computer 710 can be any suitable computer such as, for example, a personal computer with a data acquisition module installed therein. In various embodiments, instrumentation and control module 720 can include an analog-to-digital converter (ADC), a digital-to-analog converter (DAC), signal conditioners, and system controls. Instrumentation and control module 720 can include, for example, a National Instruments signal conditioning system. The ADC and DAC process information input into the instrumentation and control module 720, and can coordinate with the system controls to operate the other modules in system 700. For example, the ADC, the DAC, and the system controls can control relay 730, and/or power supply 760. In various embodiments, power supply 760 can be programmable. Power supply 760 can be, for example, a Hewlett-Packard model 6032A power supply. Power supply 760, in conjunction with instrumentation and control module 720, can apply a current ramp, such as an increasing or decreasing current ramp of predetermined slopes, to battery 750. In various embodiments, power supply 760 and/or instrumentation and control module 720 can include computer software that controls the slope of the current ramp.

In various embodiments, control relay 715/730 is used to connect battery 750 whose capacity is to be determined, to power supply 760. For example, instrumentation and control module 720 can control relay 715/730 by applying a contact closure control signal over a line 717 to switch battery 750 in and out of the circuit. When relay 715/730 is open, battery 750 is taken out of the circuit and no current is applied. When relay 715/730 is closed, battery 750 is in the circuit and a current can be applied. Current sensor 740, such as a current shunt, can be placed in series with battery 750. An exemplary current sensor 740 can include, for example, a 50-amp/50-millivolt shunt, and can be connected to a channel of the ADC. Other suitable techniques can be used to measure current, such as a Hall Effect device. Measured parameters, such as voltage and current, both analog quantities, can be converted to digital form by ADC in instrumentation and control module 720. The digital data of these parameters can be supplied to control computer 710. Current sensor 740 can be used to measure the amount of current going to, and coming from, battery 750.

Referring to FIG. 7, various embodiments can further include an automated system for charging a battery. Automated system 700 can include a power supply 760 and a controller 720. Controller 720 can cause power supply 760 to apply a current ramp test to a battery 750. Controller 720 can further control charging of battery 750 after a gassing point of the battery is determined. System 700 can further include a sensor 740 to detect a battery current and to detect gas points during the current ramp test. Sensor 740 can send data to controller 720 to be converted from analog to digital before being sent to a computer 710. Further the battery voltage can be measured using the instrumentation and control module 720.

Various embodiments include a computer readable medium. For example, embodiments can include a power supply control program that can control the amount of current supplied to the battery. The power supply control program can be stored in at least one of control computer 710, instrumentation and control module 720, and power supply 760. The power supply control program can include subroutines that direct power supply 760 to apply an increasing and/or decreasing current ramp to battery 750.

Various embodiments can include a current sensor program code that can control current sensor 740 to measure the battery current when the current ramp is applied to battery 750. The current sensor control program can be stored in at least one of control computer 710, instrumentation and control module 720, and current sensor 740. The instrumentation and control module 720 can measure the response voltage of battery 750 when the power supply control program directs power supply 760 to apply an increasing current ramp to battery 750. The instrumentation and control module 720 and/or control program can measure the response voltage of battery 750 when the power supply control program directs power supply 760 to apply a decreasing current ramp to battery 750.

Various embodiments can include a program code for processing and determining the time ($t_1$) when the current to the battery 750 reaches a maximum current ($I_{peak}$) and program code for processing and determining the second time ($t_2$) when the battery terminal voltage reaches a maximum voltage ($V_{peak}$). Also included can be program code for determining a gassing point, which can be determined from the battery terminal voltage. Further, embodiments can include program code for determining a differential (d), which corresponds to a magnitude of defects in the battery 750, and where (d) follows equation [1] shown above. These program codes can be stored in at least one of control computer 710 and instrumentation and control module 720. These program codes can receive information from instrumentation and control module 720, power supply 760, and current sensor 740 and generate a graph, such as, for example the graph shown in FIG. 3. Various embodiments can also include program code for determining whether (d) is less than, equal to, or greater than a delay (D), above which indicates the battery has an unacceptable magnitude of defects. Various values of (D) can be stored with the various program codes. The relationship between the differential (d) and the delay (D) can be displayed to a user.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A battery defect detection method for a battery having a lead acid construction, the method comprising:
   determining a safe voltage value and a current limit value for the battery;
   measuring a battery voltage value in real time at the battery terminals;
   applying an increasing current ramp to the battery over a duration of time $t_1$ that is non-zero until the current reaches a predetermined current value $I_{peak}$, wherein $I_{peak}$ is selected from the current value measured when the safe voltage value is attained and the current limit value;
   recording the time ($t_1$);
   applying a decreasing current ramp after $I_{peak}$ is reached;
   recording a time $t_2$ when the battery voltage value reaches a maximum voltage ($V_{peak}$) after $I_{peak}$ is reached;
   calculating a differential $(d)=/(t_1)-(t_2)/$;
   comparing the differential (d) to a predetermined delay (D)>0;
   accepting the battery as good when (d)<(D); and
   rejecting the battery as bad when (d)≧(D).

2. The battery defect detection method of claim 1, wherein the step of applying the increasing current ramp comprises linearly increasing the current.

3. The battery defect detection method of claim 1, wherein the step of applying a decreasing current ramp is applied until the current ramp reaches the zero value.

4. The battery defect detection method of claim 3 further comprising:
   determining a gassing point based on the battery voltage value.

5. The battery defect detection method of claim 1, wherein (D) is at least 3.0 seconds.

6. The battery defect detection method of claim 1, wherein the battery is acceptable if a percentage value of the delay (D) to a total current ramp time $t_1$ is greater than a selected percentage.

7. The battery defect detection method of claim 1, wherein (D) is determined for each of a variety of types of batteries and wherein (D) is published with a capacity rating of the batteries.

8. The battery defect detection method of claim 1, wherein the defect determination is applied to the battery without removing the battery from the battery's operating position.

9. A battery defect detection apparatus for a battery having a lead acid construction, the apparatus comprising:
   a control module comprising an analog-to-digital converter, a digital-to-analog converter, and an electronics control system;
   a power supply that supplies a current ramp to the battery;
   a display having a capacity degradation indicator for the battery;
   a sensor electrically connected to the battery to measure the battery current; and
   a processor that records a first time ($t_1$) when a current of the battery reaches a maximum current ($I_{peak}$); records a second time ($t_2$) after ($t_1$) when a terminal voltage of the battery reaches a maximum voltage ($V_{peak}$), calculates a differential $(d)=/(t_1)-(t_2)/$;
   compares the differential (d) to a predetermined delay (D); indicates through the capacity degradation indicator on the display that the battery is unacceptable when (d)≧(D)>0; and indicates through the capacity degradation indicator on the display that the battery is acceptable when (d)<(D).

10. The battery defect detection apparatus of claim 9, wherein the current comprises an increasing current ramp.

11. The battery defect detection apparatus of claim 9, wherein the current increases linearly.

12. The battery defect detection apparatus of claim 9, wherein the processor is adapted to measure the battery terminal voltage while the current is applied and wherein the processor is adapted to determine a gassing point based on the battery terminal voltage.

13. A computer readable medium containing program code that configures a processor to perform a method for determining the magnitude of defects in a lead acid battery, said program code comprising:

program code for controlling application of a current to the battery over a time period that is non-zero;

program code for recording a first time ($t_1$) when a current of the battery reaches a maximum current ($I_{peak}$);

program code for recording a second time ($t_2$) after the first time ($t_1$) when a terminal voltage of the battery reaches a maximum voltage ($V_{peak}$);

program code for calculating a differential $(d)=|(t_1)-(t_2)|$;

program code for comparing the differential (d) to a predetermined non-zero delay (D);

program code for displaying an indicator that the battery is bad when $(d) \geq (D)$; and program code for displaying an indicator that the battery is good when $(d)<(D)$.

14. The computer readable medium containing program code of claim 13 further comprising:

program code for measuring the battery terminal voltage while the current is applied; and program code for determining a gassing point, wherein the gassing point is determined from the battery terminal voltage.

* * * * *